(12) United States Patent
Emami

(10) Patent No.: US 11,147,129 B2
(45) Date of Patent: Oct. 12, 2021

(54) INDUSTRIAL HEATER

(71) Applicant: Arsalan Emami, Aliso Viejo, CA (US)

(72) Inventor: Arsalan Emami, Aliso Viejo, CA (US)

(*) Notice: Subject to any disclaimer, the term of this patent is extended or adjusted under 35 U.S.C. 154(b) by 901 days.

(21) Appl. No.: 15/456,466

(22) Filed: Mar. 10, 2017

(65) Prior Publication Data

US 2017/0265252 A1    Sep. 14, 2017

Related U.S. Application Data

(60) Provisional application No. 62/306,611, filed on Mar. 10, 2016.

(51) Int. Cl.
*H05B 3/62* (2006.01)
*H01L 21/67* (2006.01)
(Continued)

(52) U.S. Cl.
CPC .......... *H05B 3/62* (2013.01); *F27B 7/00* (2013.01); *F27D 11/02* (2013.01);
(Continued)

(58) Field of Classification Search
CPC .......... H05B 3/62; H05B 2203/003; H05B 2203/004; H05B 3/64; H05B 3/55;
(Continued)

(56) References Cited

U.S. PATENT DOCUMENTS 3,800,057 A    3/1974    Kulmann-Schafer
4,159,415 A    6/1979    Williams
(Continued)

FOREIGN PATENT DOCUMENTS

GB    1248574    10/1971
GB    2094960    9/1982
(Continued)

OTHER PUBLICATIONS

PCT Preliminary Report on Patentability—PCT/IB2012/054575, dated Mar. 14, 2013.
(Continued)

*Primary Examiner* — Dana Ross
*Assistant Examiner* — Michael S. Poetzinger
(74) *Attorney, Agent, or Firm* — Ricky Lam

(57) ABSTRACT

Systems and methods to improve an industrial heater are disclosed. The heater comprises a horizontal cylinder oriented parallel to the ground and may encase an interior recess running the length of the heater. The heater may be divided into a plurality of sections or zones. One or more mid-rings may support the structure of the heater, and may be disposed at the intersections of adjacent sections or zones. A plurality of interior boards and/or insulation layers may line the interior façade, and may be configured to overlap each other and/or interlock together. The interlocking structure may be absent of any gap or space to prevent heat loss from the interior recess. One or more heat strips may be configured in a sinusoidal pattern. The strips may be mirrored on the opposite side of the interior recess, and may be configured to elongate in the direction opposite of gravity.

16 Claims, 11 Drawing Sheets

(51) Int. Cl.
  *F27B 7/00* (2006.01)
  *F27D 11/02* (2006.01)
  *H01L 21/673* (2006.01)

(52) U.S. Cl.
  CPC .. *H01L 21/67098* (2013.01); *H01L 21/67103* (2013.01); *H01L 21/67109* (2013.01); *H01L 21/67248* (2013.01); *H01L 21/67306* (2013.01); *H01L 21/67316* (2013.01); *H05B 2203/003* (2013.01); *H05B 2203/004* (2013.01)

(58) Field of Classification Search
  CPC ..... H05B 3/66; F27B 7/00; F27B 5/08; F27D 11/02; F27D 1/0036; H01L 21/67098; H01L 21/67109; H01L 21/67248; H01L 21/67306; H01L 21/67316
  USPC ....... 219/470, 461.1, 201; 373/117–119, 130
  See application file for complete search history.

(56) References Cited

U.S. PATENT DOCUMENTS

| | | | |
|---|---|---|---|
| 4,503,319 A | 3/1985 | Moritoki | |
| 4,604,056 A * | 8/1986 | Jones | C21D 1/773 432/234 |
| 5,187,771 A | 2/1993 | Uchida | |
| 5,763,856 A | 6/1998 | Ohkase | |
| 5,896,410 A | 4/1999 | Nguyen et al. | |
| 6,005,225 A | 12/1999 | Kowalski et al. | |
| 6,756,565 B2 | 6/2004 | Suenaga et al. | |
| 6,807,220 B1 | 10/2004 | Peck | |
| 6,949,719 B2 | 9/2005 | Suenaga et al. | |
| 7,003,014 B2 * | 2/2006 | Uemori | H05B 3/64 373/117 |
| 7,888,622 B2 | 2/2011 | Nakao et al. | |
| 7,974,525 B2 | 7/2011 | Kobayashi et al. | |
| 8,023,806 B2 | 9/2011 | Ichikawa et al. | |
| 8,476,560 B2 | 7/2013 | Kobayashi et al. | |
| 10,204,806 B2 * | 2/2019 | Emami | H01L 21/67109 |
| 2002/0081250 A1 | 6/2002 | Lord | |
| 2002/0088610 A1 | 7/2002 | Suenaga et al. | |
| 2004/0195230 A1 | 10/2004 | Suenaga et al. | |
| 2005/0069014 A1 * | 3/2005 | Uemori | H05B 3/64 373/109 |
| 2005/0237661 A1 | 10/2005 | Blake | |
| 2006/0083495 A1 | 4/2006 | Taiquing | |
| 2007/0045279 A1 * | 3/2007 | Emami | H05B 3/64 219/461.1 |
| 2008/0296282 A1 | 12/2008 | Kobayashi et al. | |
| 2009/0035948 A1 | 2/2009 | Miyata | |
| 2009/0095422 A1 | 4/2009 | Sugishita et al. | |
| 2010/0224614 A1 | 9/2010 | Kobayashi et al. | |
| 2012/0061377 A1 | 3/2012 | Agamohamadi et al. | |
| 2012/0308216 A1 | 12/2012 | Bryce | |
| 2013/0058372 A1 * | 3/2013 | Emami | H01L 21/67109 373/117 |
| 2014/0287375 A1 | 9/2014 | Kosugi | |
| 2015/0093909 A1 | 4/2015 | Murata et al. | |

FOREIGN PATENT DOCUMENTS

| | | |
|---|---|---|
| JP | 04369215 | 12/1992 |
| JP | 3108134 | 11/2000 |
| JP | 2002151237 | 5/2002 |
| WO | 2007097199 | 8/2007 |
| WO | 2013035041 | 3/2013 |
| WO | 2013035044 | 3/2013 |

OTHER PUBLICATIONS

PCT Preliminary Report on Patentability—PCT/IB2012/054572, dated Mar. 14, 2013.

* cited by examiner

INDUSTRIAL HEATER

CLAIMS OF PRIORITY

This patent application is a continuation-in-part and claims priority from:
(1) U.S. provisional patent application No. 62/306,611, entitled 'Improved cylindrical heater for processing and manufacturing", filed Mar. 10, 2016.

FIELD OF TECHNOLOGY

This disclosure relates generally to heaters or furnaces. In one example embodiment, methods, apparatus, and systems of a horizontal heater with innovative features which may be used in semiconductor manufacturing.

BACKGROUND

Across multiple industries, heaters and furnaces are enlisted to provide for a variety of tasks such as in manufacturing for drying, tempering, sanitizing, setting, and others. The heaters, as with the nature of their use, have parts and structures which are exposed to repeated and extreme temperatures and temperature differentials, such as in heating and cooling cycles. Due to the conditions the heaters are exposed to, and the materials and structures they are composed of, the wear rate is drastically increased. In such a typical life cycle, the furnace structure, as well as the heat elements, typically experience hundreds, thousands or more thermal cycles. The heater then must be designed for longevity, both in terms of heating and cooling cycles, but also the ability to withstand high temperatures for an extended period of time as in many applications using heaters require the furnace structure and heat elements to maintain a uniform high temperature over a period of time. In addition, portions of the furnace structure may not expand at the same rate when the heater is being heated to, or is at, high temperatures for a prolonged period of time. Such expansion may result in crack sand breakage of the furnace structure as well as other structural deformities or play. For example, heat elements such as resistance wires may expand, grow, or elongate due to operating at high temperatures. When these wires are held firmly by ceramic separators at some fixed points for mechanical stability, they may expand or elongate beyond these points, and eventually the wires may come in contact with one another or may touch a "process tube", e.g., a glass tube encompassing objects and elements, such as semiconductor substrates, and may lead to premature failure or breakage.

Many process steps in the manufacturing of semiconductor devices are performed in a furnace or heater comprising various amounts of sections or zones, including a wafer loading assembly for transferring wafers to, and from, the furnace. The presence of multiple sections or zones provides problems exacerbated by the aforementioned heating and cooling cycles of the heater or furnace.

When heaters with multiple zones are used to apply the desired heating temperature and protocol to a workpiece, often one zone is subject to more heat loss or higher demand for heat generation in comparison with other zones of the heater. Such higher demand for energy typically results in faster oxidation of various components comprising the heat elements, typically the metal used in resistance wires, and failure of that particular zone before failure of components in other zones as well as differing heat or cooling differentials across different materials and zones causes expansion and contraction problems.

Thus, there is a need for improvements within horizontal heaters that reduces structural or material problems associated with the work cycle of a heater, especially with heaters or furnaces that are complex with multiple structures, materials and zones.

SUMMARY

Disclosed are a system and a method for an industrial heater with enhanced features to aide in longevity and resiliency of the components, structure and work cycle.

In one aspect, the present invention discloses an industrial heater wherein the heater structure comprises a horizontal cylinder oriented parallel to the ground and may encase an interior recess running the length of the heater. The interior recess may incorporate mechanisms and structures, such as, e.g., heat elements or strips and insulating blocks, that may aid in heating and processing objects, such as, e.g., a quartz wafer boat for holding semiconductor wafers. The interior recess may also comprise a cylinder shape.

The heater may be divided into a plurality of sections or zones, which may be defined as subsections of the interior and exterior structures of the horizontal heating cylinder. One or more mid-rings may support the structure of the heater, and may be disposed at the intersections of adjacent sections or zones. During processing, each section or zone may be heated to the same temperature or to different temperatures and/or may provide different heating characteristics, such as, e.g., through differently patterned heat elements, varying proximity of an object to be heated to the heat elements, and/or varying amount of time that the object is heated.

Each section or zone may comprise individual heating mechanisms, internal structures, and/or external structures that may be replaceable or interchangeable. A plurality of interior boards and/or insulation layers may line the interior façade of the heater, and may be configured to overlap each other and/or interlock together. The interlocking structure may be absent of any gap or space to prevent heat loss from the interior recess due to convection and radiation. Another benefit of the interlocking structure is that it may allow the heater to be easily refurbished with new parts, instead of having to replace an entire heater if a section breaks down.

In another aspect, the present invention discloses a system and a method for a heat element, such as, e.g. a heat strip, for an industrial heater comprising a cylinder shape. One or more heat strips may be coupled to an inner wall of the heater by a connecting means, such as, e.g., a staple, a clip, a screw, or a weld, and may run in parallel to the length, or a part of the length, of the recess. The strips may protrude into the recess, which may be positioned in parallel to the ground plane. In some embodiments, the protrusion of the heat strips into the recess may be configured in an evenly spaced pattern for even heating, while in other embodiments, the heat strips may be configured in an unevenly spaced pattern such that an area of high density strips may provide for an increased amount of heat in the said area, and vice versa. The heat strips may be configured to not interfere or make contact with the object to be heated, which may contaminate the object and/or lead to premature failure of the heater.

One or more heat strips may begin or terminate on each respective side of a mid-ring in each section or zone such that each section or zone has its own set of heat strips, and that the strips do not continue through a mid-ring separator. In some embodiments, the strips may pass through the mid-ring such that one or more sections or zones may share the same continuous strip from one end of the cylinder to the other, or at least through two sections or zones separated by one mid-ring. The heat strips may be arranged along an inner wall of the sections or zones of the heater and may comprise one or more spaces between each row, structure or other component that permits independent elongation and retraction of the strips without contacting another heat strip or other component at high temperature and low temperature fluctuations. This free movement eliminates one of the failure mechanisms associated with conventional heaters.

Additionally, the heat strips may be configured to permit elongation only in the direction opposite of the force of gravity at high temperatures. Once the strips reach high temperatures, such as, e.g., above 1000-degrees C., their structure becomes very soft and fluid. In that state, gravity can increase the wire or strip expansion if gravity is in the same direction of the expansion.

The heat strip may be configured in a pattern, such as, e.g., a wave or sinusoidal shape, a zigzag shape, a bulbous wave or sinusoidal shape, or any other shape that can increase surface area of the strip 502. The length of strip 502 may be run in parallel with respect to the length of the heater, and may be configured to not make contact with any other structure, which in turn may cause stress or fatigue. Additionally, heat strip 502 may be respectively mirrored on the opposite side of the cylinder-shaped heater by a corresponding strip. Strip 502 may be mirrored in structure, pattern, and organization along a dividing line that is perpendicular to the horizontal, e.g., vertical hemisphere, such that a mirror image of strip 502 is positioned on each half of the heater. This feature may help improve the life of the heater by permitting elongation only in the direction opposite of gravity; thus, gravity acts as a force against elongation, which may ultimately reduce overall elongation of the strip to maintain shape and proper function.

In yet another aspect, the present invention discloses a system and a method to bus one or more heat strips, and to provide power to an industrial heater. The heat strips may be coupled to a bus panel of the heater, which in turn may be coupled to an inlet lead and an outlet lead. The leads may be coupled to a power source on the exterior of the heater in order to permit proper cooling, and to ultimately to prevent premature failure, of the leads. There may be any plurality of leads positioned along the length of the heater and at any location suitable for the design specification, such as, e.g., a set of inlet lead and outlet lead for every section or zone of the heater. In addition, there may be a bus panel for each section or zone, or a single bus panel for all sections and zones of the heater. A bus panel may be coupled to a single heat strip or a plurality of heat strips, either from the same section or zone or a different section or zone. The bus panel may also provide connectivity and power to other devices of the heater.

A disadvantage of traditional heaters may be due to comprising a single terminal lead positioned in between multiple sections or zones, and may serve two functions. The first function may be to provide a current return line for one section or zone, and the second function may be to provide a current input line for an adjacent section or zone. In other words, the same lead may carry current for two sections or zones. Overload of the electrical current may cause the terminal lead to heat up, and often melt or freeze the bolts and nuts connecting the lug to the lead. On the contrary, the present invention discloses a heater comprising separate input and output leads for each section or zone, which may prevent current overload.

BRIEF DESCRIPTION OF THE DRAWINGS

Example embodiments are illustrated by way of example and are not limited to the figures of the accompanying drawings, in which, like references indicate similar elements.

DETAILED DESCRIPTION

Disclosed are methods and systems to improve an industrial heater. The improvements may provide features to aide in longevity and resiliency of individual components. Although the present embodiments have been described with reference to specific example embodiments, it will be evident that various modifications and changes may be made to these embodiments without departing from the broader spirit and scope of the various embodiments. In addition, the components shown in the figures, their connections, couples, and relationships, and their functions, are meant to be exemplary only, and are not meant to limit the embodiments described herein.

In at least one embodiment, the present invention discloses an industrial heater wherein the heater structure comprises a horizontal cylinder oriented parallel to the ground and may encase an interior recess running the length of the heater. The interior recess may incorporate mechanisms and structures, such as, e.g., heat elements or strips and insulating blocks, that may aid in heating and processing objects, such as, e.g., a quartz wafer boat for holding semiconductor wafers. The interior recess may also comprise a cylinder shape.

Figure 1A:
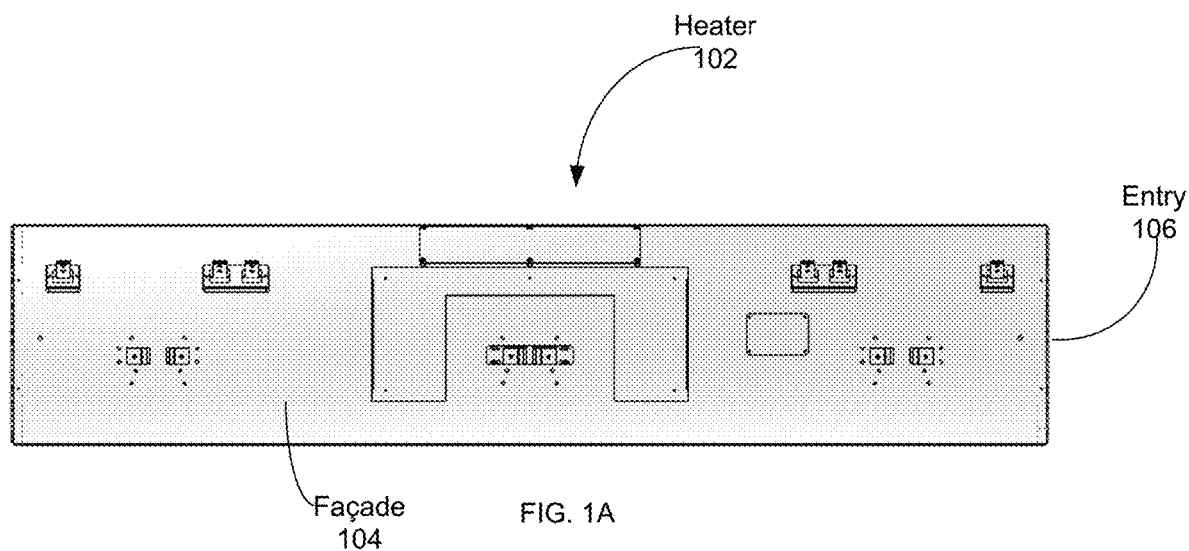
FIG. 1A is a side view of the exterior of an industrial heater.
Figure 1B:
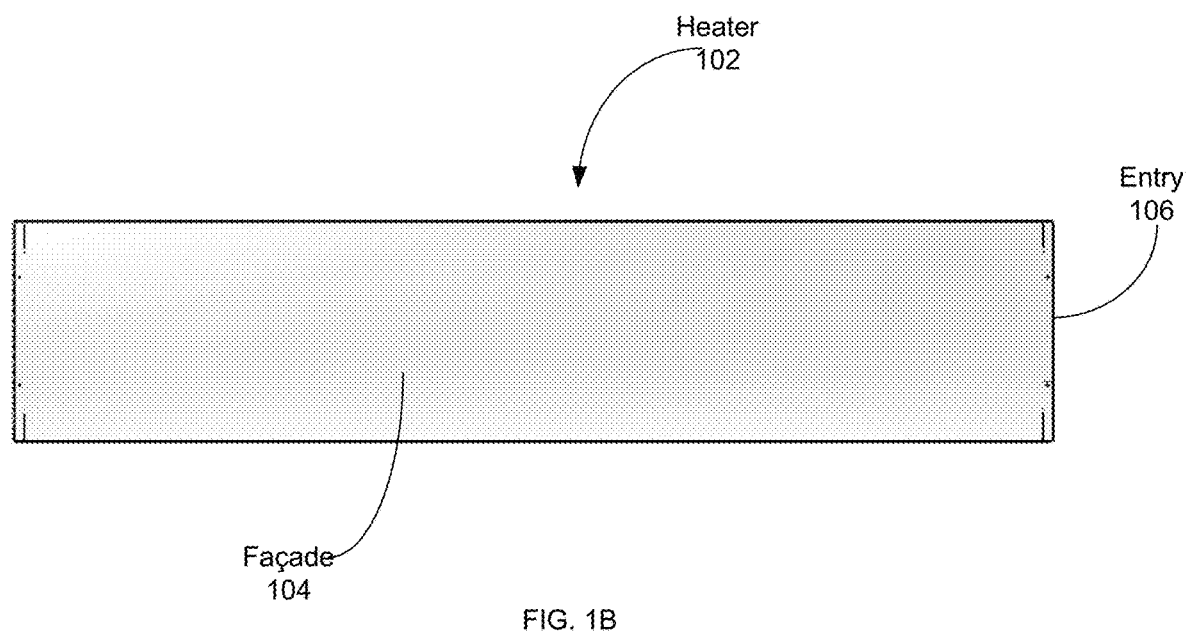
FIG. 1B is an opposite side view of the exterior of the industrial heater, according to at least one embodiment.

FIG. 1A is a side view of the exterior of an industrial heater, and FIG. 1B is an opposite side view of the exterior of the industrial heater, according to at least one embodiment. A horizontal cylindrical heater 102 may comprise an exterior façade 104 and an interior recess entry 106. Entry 106 may permit a substrate or object, such as, e.g., a quartz wafer boat, to enter the heater's interior.

The heater may be divided into a plurality of sections or zones, which may be defined as subsections of the interior and exterior structures of the horizontal heating cylinder. One or more mid-rings may support the structure of the heater, and may be disposed at the intersections of adjacent sections or zones. During processing, each section or zone may be heated to the same temperature or to different temperatures and/or may provide different heating characteristics, such as, e.g., through differently patterned heat elements, varying proximity of an object to be heated to the heat elements, and/or varying amount of time that the object is heated.

The mid-ring may be configured to protrude into the interior recess of the heater such that the heater is compartmentalized or sectionalized into subsections or sub-recesses. The protrusion may partially or completely isolate and/or insulate each section or zone of the recess from an adjacent section or zone to provide additional heating control, such as, e.g., to maintain temperature differentials. In some embodiments, the mid-ring may be flushed with the interior and/or exterior façades such that the object to be heated may span through, or may be situated in, multiple sub-recesses. This configuration may also allow the object to move freely from one section or zone to the next through the mid-rings, such as, e.g., through a conveyer system. The mid-ring may comprise a same material or different materials to that of the interior recess, such as, e.g., a metal, an alloy, an insulating substance, a composite and/or a polymer.

Each section or zone may comprise individual heating mechanisms, internal structures, and/or external structures that may be replaceable or interchangeable. A plurality of interior boards and/or insulation layers may line the interior façade of the heater, and may be configured to overlap each other and/or interlock together. The interlocking structure may be absent of any gap or space to prevent heat loss from the interior recess due to convection and radiation. Another benefit of the interlocking structure is that it may allow the heater to be easily refurbished with new parts, instead of having to replace an entire heater if a section breaks down.

Figure 2:
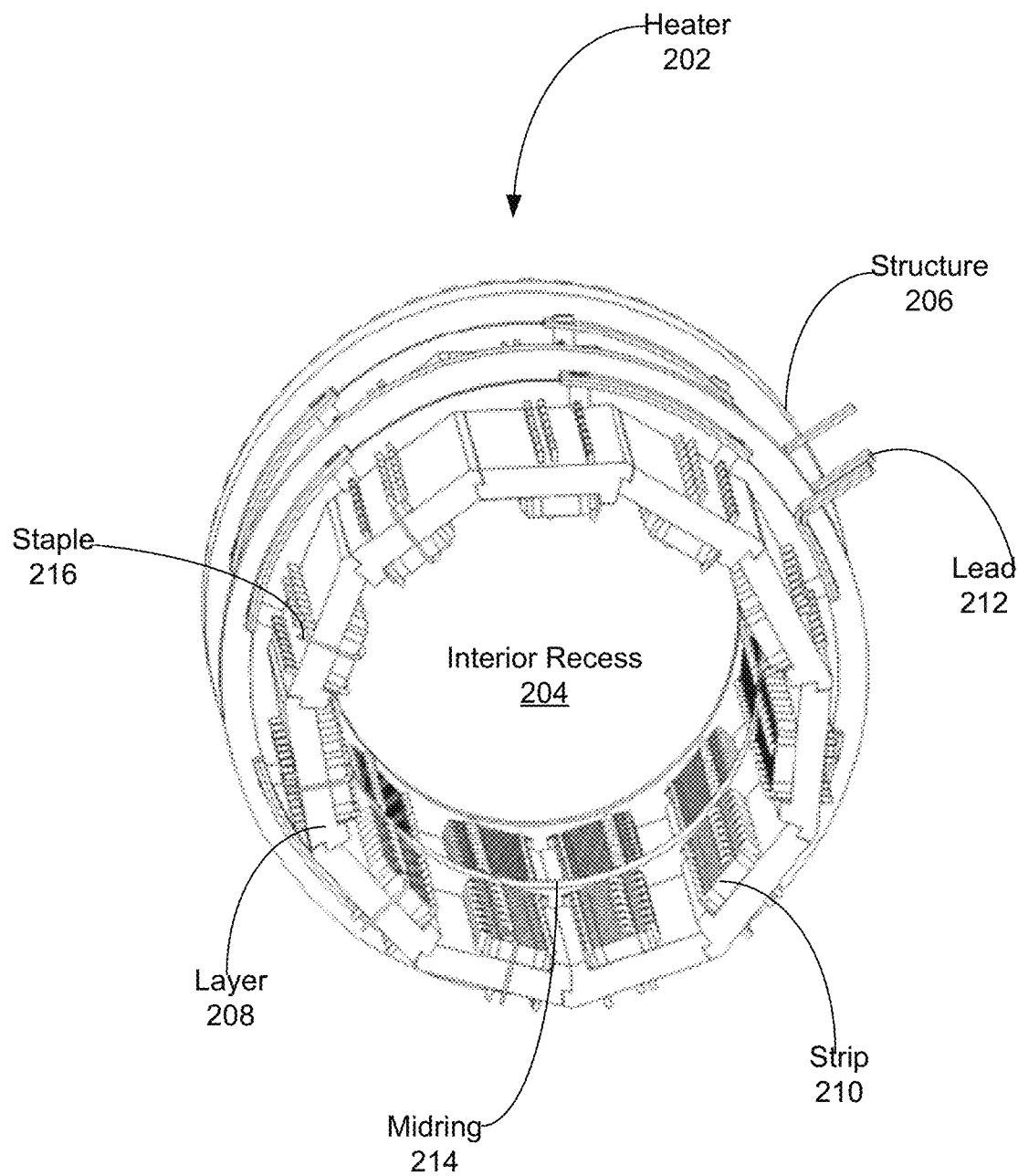
FIG. 2 is a perspective view of cutaway diagram of an industrial heater showing internal and external structures, according to at least one embodiment.

FIG. 2 is a perspective view of cutaway diagram of an industrial heater showing internal and external structures, according to at least one embodiment. Cylindrical heater 202 may comprise interior recess 204, wherein an object to be processed or heated may be automatically or manually inserted. Heater 202 may comprise multilayered structure 206 that surrounds interior recess 204. The multi-layered structure 206 may include insulation layer 208 comprising overlapping or interlocking blocks, wherein the blocks may reduce heat transfer to the exterior of heater 202. Interior recess 204 may comprise heat strip 210 which may be patterned in, e.g., a sinusoidal or wave pattern, a zigzag pattern, a bulbous wave or sinusoidal pattern, or any other pattern that can increase surface area of the strip 210, and may run in rows parallel to the length of heater 202. Heat strip 210 may be coupled to lead or wire 212 that in turn may be coupled to an exterior source that may provide power to the strip 210. The lead or wire 212 may protrude through the exterior structure 206.

Heater 202 may also comprise one or more mid-ring 214. Mid-ring 214 may either be flushed with a wall of interior recess 204, or it may protrude completely or partially through to the recess 204 which may provide separation or insulation between the sections or zones of the heater 202. Heat strip 210 may be positioned or mounted onto insulation layer 208 by staple 216, of which may provide insulation and support to strip 210.

Figure 3:
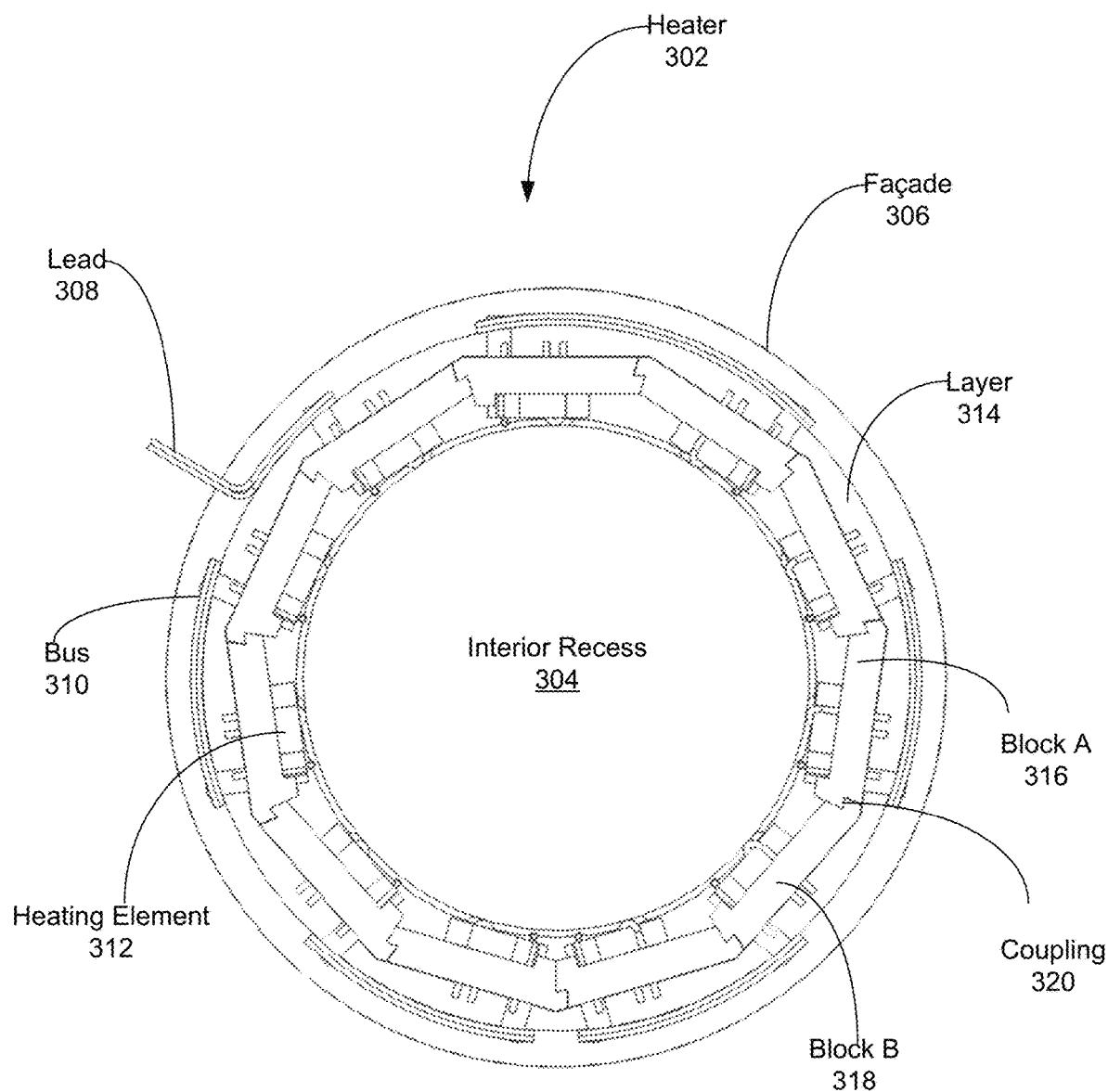
FIG. 3 is a horizontal cross-section view of an industrial heater showing internal structures, according to at least one embodiment.

FIG. 3 is a horizontal cross-section view of an industrial heater showing internal structures, according to at least one embodiment. Heater 302 may comprise interior recess 304 and multiple layers and features impregnated, situated or fastened to its structure. This may include an exterior façade 306 which may be present with a plurality of sub layers for insulation, wiring and/or mechanical functions, such as, e.g. a cut-through or a recess for placement of leads or wires. Power lead or wire 308 may be coupled to bus 310 of which may be coupled to heat element 312 in order to provide heat to interior recess 304 of the heater 302, which in turn heats an object placed within the recess 304. The heater 302 may include layer 314 which may function to support the structure of heater 302, and/or it may provide additional insulation.

Additionally, heater 302 may comprise insulation block A 316 and insulation block B 318 of which may be overlapping and/or interlocking as seen by coupling 320. This design may allow the heater 202 to work more efficiently as there may be no gaps for heat leakage at coupling 320 and improves overall rigidity and structure of the heater. It is noted that the insulation may be made of any material one in the art would find appropriate, such as, e.g., mica, aluminum silicate, and/or ceramic.

Figure 4A:
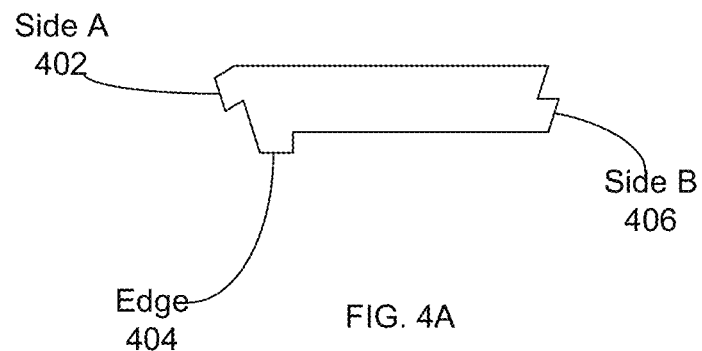
FIG. 4A is a top view of a single insulation board, according to at least one embodiment.

FIG. 4A is a top view of a single insulation board, according to at least one embodiment. The shape may comprise a couple of straight lines on opposing sides of its length and resembling that of a rectangle. The remaining opposing sides may comprise a plurality of edges. In the instant example, one of these remaining sides, side A 402, comprises six edges and five corners (not including two extra corners it makes at the contact points with the first opposing sides). In addition, one of its six edges, edge 404, may extend beyond one of the first opposing sides, such that it is wider than the shape's length. The other remaining side, side B 406, comprises three edges and two corners (not including 2 extra corners it forms at the contact points with the first opposite sides). None of side B 406's edges extend beyond any of the first opposing sides. The present shape may allow side A 402 of an insulation board to mate and interlock with side B 406 of another insulation board, and wherein a predetermined amount of insulation boards are designed to mate and interlock to completely surround and insulate a cylinder-shaped heater of the present invention.

Figure 4B:
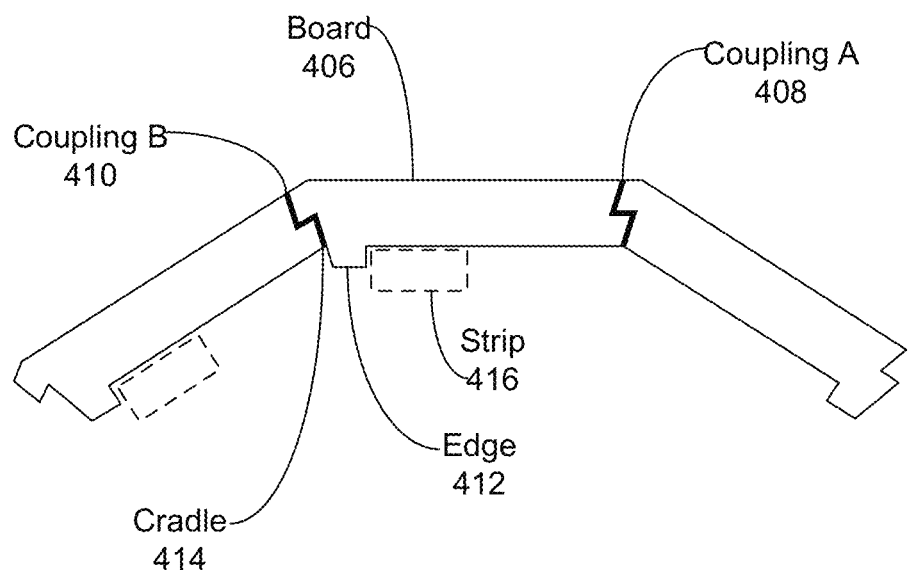
FIG. 4B is a top view of a plurality of insulation boards, according to at least one embodiment.

FIG. 4B is a top view of a plurality of insulation boards, according to at least one embodiment. Board 406 may overlap and/or interlock with an adjacent board, as shown at coupling A 408, to create a strong fit that does not comprise any gap or space to prevent heat loss. Coupling A 408 may comprise a shape that resembles a backward letter Z. Board 406 may overlap or interlock with another board on the opposite side of the first adjacent board, as shown at coupling B 410. Due to extended edge 412 of board 406, coupling B 410 produces cradle 414, which may be a space between two edges of adjacent and/or interlocked board 406. Heat strip 416 may be disposed against raised edge 412, which may function as a physical barrier preventing the strips from coming into contact with, or radiating heat to, another heat strip or other structures.

A typical horizontal heater used in semiconductor manufacturing comprises a single coil, made from a round wire. This type heater does not take into account the dynamics of the heater wire throughout its life. Wire expansion may be a leading cause of premature failure of industrial heaters. Use of a heat strip versus the traditional round wire has advantages. First, the strip cannot bend inward, along its length, and touch the process tube placed inside the heater. Any contact between the resistance wire or strip can result in contamination of the product and premature failure of the heater. This failure mechanism is more prevalent at high temperatures, where the wire expands and retracts more aggressively with temperature ramp up and ramp downs. Second, the strip has a more exposed surface when compared to the round wire in this application. The exposed surface accounts for more than 90% of a strip's surface area, in comparison to 60-70% for a round wire. The benefit is faster and more efficient heating of substrates. And importantly, a lower temperature of the strip may be needed to reach the same target temperature when compared to the round wire. The lower temperature of the strip will result in longer operating life.

In at least one embodiment, the present invention discloses a system and a method for a heat element, such as, e.g. a heat strip, for an industrial heater comprising a cylinder shape. One or more heat strips may be coupled to an inner wall of the heater by a connecting means, such as, e.g., a staple, a clip, a screw, or a weld, and may run in parallel to the length, or a part of the length, of the recess. The strips may protrude into the recess, which may be positioned in parallel to the ground plane. In some embodiments, the protrusion of the heat strips into the recess may be configured in an evenly spaced pattern for even heating, while in other embodiments, the heat strips may be configured in an unevenly spaced pattern such that an area of high density strips may provide for an increased amount of heat in the said area, and vice versa. The heat strips may be configured to not interfere or make contact with the object to be heated, which may contaminate the object and/or lead to premature failure of the heater.

One or more heat strips may begin or terminate on each respective side of a mid-ring in each section or zone such that each section or zone has its own set of heat strips, and that the strips do not continue through a mid-ring separator. In some embodiments, the strips may pass through the mid-ring such that one or more sections or zones may share the same continuous strip from one end of the cylinder to the other, or at least through two sections or zones separated by one mid-ring. The heat strips may be arranged along an inner wall of the sections or zones of the heater and may comprise one or more spaces between each row, structure or other component that permits independent elongation and retraction of the strips without contacting another heat strip or other component at high temperature and low temperature fluctuations. This free movement eliminates one of the failure mechanisms associated with conventional heaters.

Additionally, the heat strips may be configured to permit elongation only in the direction opposite of the force of gravity at high temperatures. Once the strips reach high temperatures, such as, e.g., above 1000-degrees C., their structure becomes very soft and fluid. In that state, gravity can increase the wire or strip expansion if gravity is in the same direction of the expansion.

Figure 5:
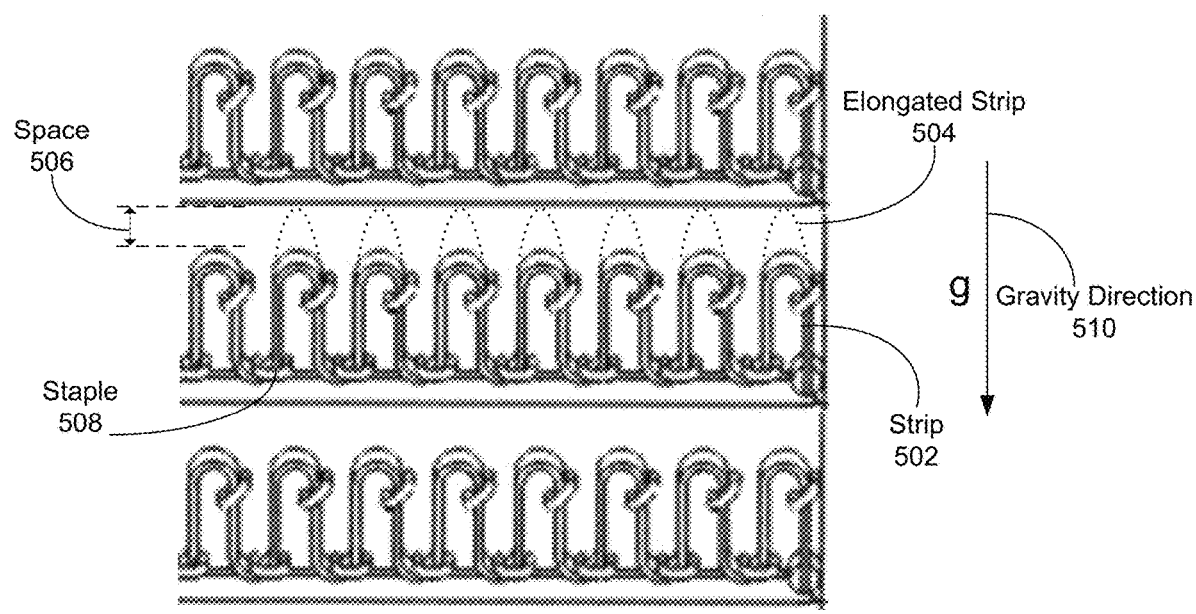
FIG. 5 illustrates a plurality of rows of heat strips, according to at least one embodiment.

FIG. 5 illustrates a plurality of rows of heat strips, according to at least one embodiment. Heat strip 502 may be at room temperature and is resting at its ground state. At high temperatures, and in its excited state, heat strip 502 may be prone to elongation, and may become disfigured, such as taking on the form of elongated strip 504. Space 506 may be an empty area or location where elongated strip 504 can occupy such that it does not make contact with any other object or structure. Since heat strip 502 is positioned on top of, and is fastened to, a solid base through staple 508, elongation of strip 502 may be halted or otherwise minimized in the direction of gravity 510. This configuration permits elongation at high temperatures only in the direction opposite of gravity, which will in turn limit elongation due to the force of gravity acting upon strip 502 and reduce wear and tear.

Heat strip 502 may be of any thickness or width based on a predetermined usage. Generally, thicker or wider strips may provide more resistance and may have a longer life-expectancy compared to a thinner strip. Each section or zone of a heater may comprise the same thickness or width, or they may comprise varying thicknesses or widths. In some embodiments, the end sections or zones of a heater may be situated closer to atmospheric temperature compared to a middle section or zone, and therefore may comprise a thicker or wider heat strip 502 in order to compensate for the higher demand in output in order to achieve desirable life expectancy.

In some embodiments, heat strip 502 may be configured in a pattern, such as, e.g., a wave or sinusoidal shape, a zigzag shape, a bulbous wave or sinusoidal shape, or any other shape that can increase surface area of the strip 502. The length of strip 502 may be run in parallel with respect to the length of the heater, and may be configured to not make contact with any other structure, which in turn may cause stress or fatigue. Additionally, heat strip 502 may be respectively mirrored on the opposite side of the cylinder-shaped heater by a corresponding strip. Strip 502 may be mirrored in structure, pattern, and organization along a dividing line that is perpendicular to the horizontal, e.g., vertical hemisphere, such that a mirror image of strip 502 is positioned on each half of the heater. This feature may help improve the life of the heater by permitting elongation only in the direction opposite of gravity; thus, gravity acts as a force against elongation, which may ultimately reduce overall elongation of the strip to maintain shape and proper function.

Figure 6:
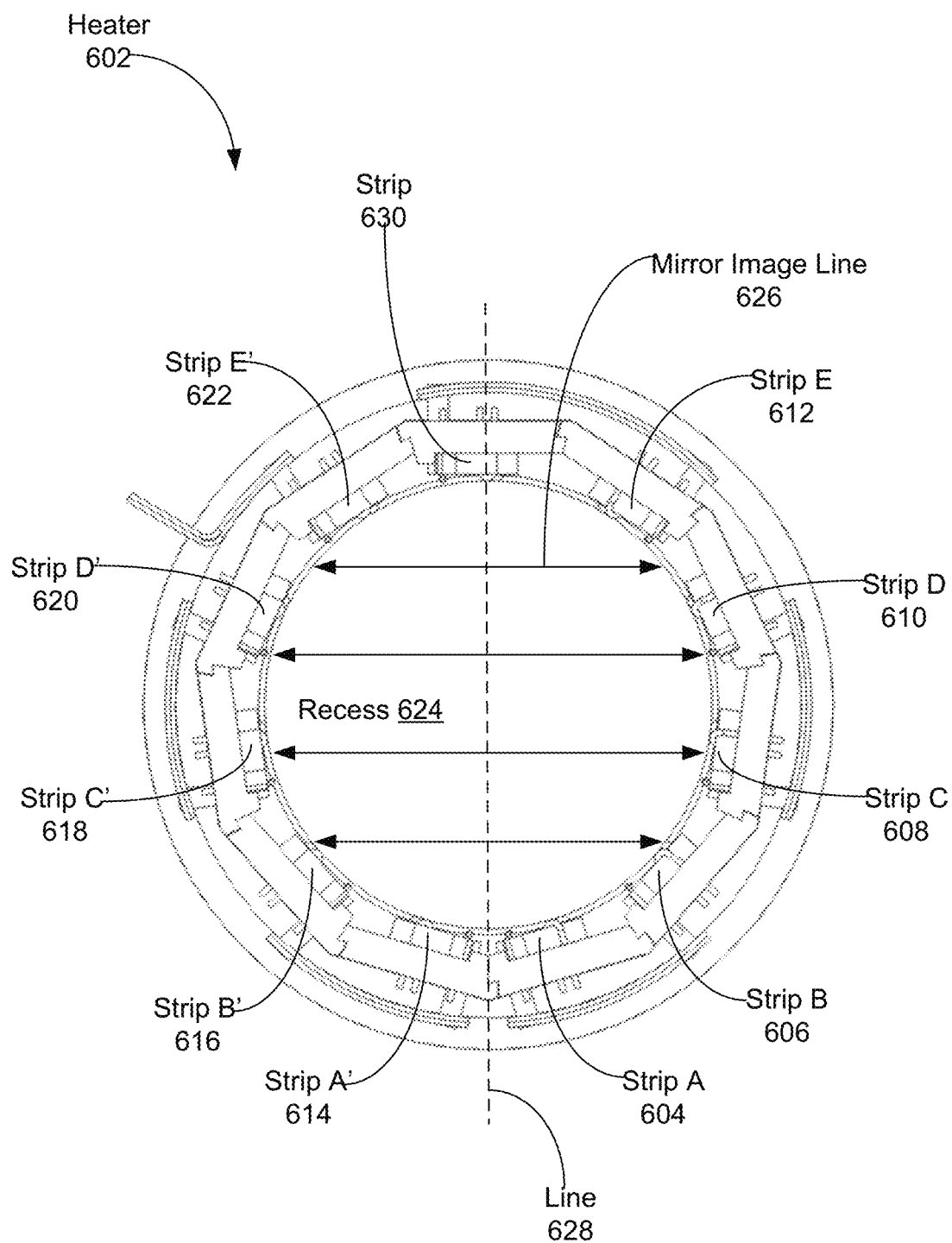
FIG. 6 is a horizontal cross-section view of an industrial heater showing internal features, according to at least one embodiment.

FIG. 6 is a horizontal cross-section view of an industrial heater showing internal features, according to at least one embodiment. Cylindrical heater 602 may comprise strip A 604, strip B 606, strip C 608, strip D 610, and strip E 612 along with corresponding and opposing strip A' 614, strip B' 616, strip C' 618, strip D' 620, and strip E' 622, and wherein the strips are symmetrically positioned along a wall of interior recess 624. Mirror image line 626 may be symmetrical along dividing line 628, which may be positioned at the center of the heater. In some embodiments, heat strip 630 may not have a corresponding symmetrical strip directly opposing it because in the exemplary embodiment there are odd number of total boards, e.g., 11 boards, and not an even number of total boards, e.g., 12 boards. A heater can comprise of any number of boards.

Figure 7:
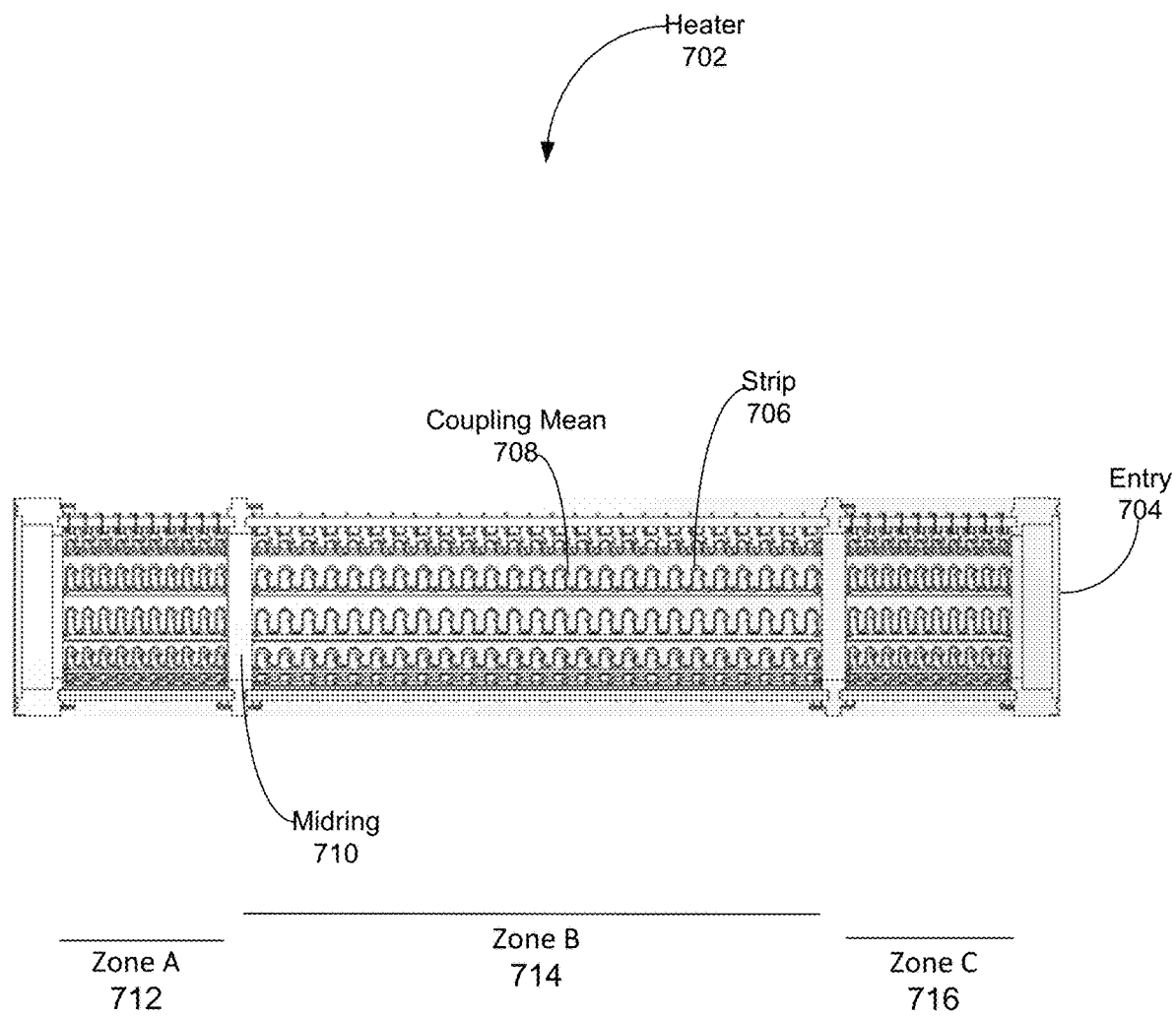
FIG. 7 is a side cut out view of an industrial heater showing internal features, according to at least one embodiment.

FIG. 7 is a side cut out view of an industrial heater showing internal features, according to at least one embodiment. Heater 702 may comprise interior recess entry 704. A plurality of heat strip 706 may be arranged in a wave or sinusoidal pattern from one end of the heater 702 to the other. Strip 706 may be fastened in a plurality of locations along the length of a support or a wall of the interior recess by a coupling mean 708, such as, e.g., a staple, a screw, a clip. Heater 702 may comprise a plurality of layers for, e.g., wiring, support, or insulation. One or more mid-ring 710 may separate the heater a plurality of sections or zones A 712, zone B 714, and zone C 716. The plurality of heat strip 706 may pass through mid-ring 710 to an adjacent compartment, or it may terminate within, or prior to touching, mid-ring 710. Additionally, mid-ring 710 may completely or partially protrude through to the interior recess causing a complete or partial isolation between the compartments, or mid-ring 710 may be flushed with the interior façade such as to not protrude through to the interior recess.

In at least one embodiment, the present invention discloses a system and a method to bus one or more heat strips, and to provide power to an industrial heater. The heat strips may be coupled to a bus panel of the heater, which in turn may be coupled to an inlet lead and an outlet lead. The leads may be coupled to a power source on the exterior of the heater in order to permit proper cooling, and to ultimately to prevent premature failure, of the leads. There may be any plurality of leads positioned along the length of the heater and at any location suitable for the design specification, such as, e.g., a set of inlet lead and outlet lead for every section or zone of the heater. In addition, there may be a bus panel for each section or zone, or a single bus panel for all sections and zones of the heater. A bus panel may be coupled to a single heat strip or a plurality of heat strips, either from the same section or zone or a different section or zone. The bus panel may also provide connectivity and power to other devices of the heater.

A disadvantage of traditional heaters may be due to comprising a single terminal lead positioned in between multiple sections or zones, and may serve two functions. The first function may be to provide a current return line for one section or zone, and the second function may be to provide a current input line for an adjacent section or zone. In other words, the same lead may carry current for two sections or zones. Overload of the electrical current may cause the terminal lead to heat up, and often melt or freeze the bolts and nuts connecting the lug to the lead. On the contrary, the present invention discloses a heater comprising separate input and output leads for each section or zone, which may prevent current overload.

Figure 8:
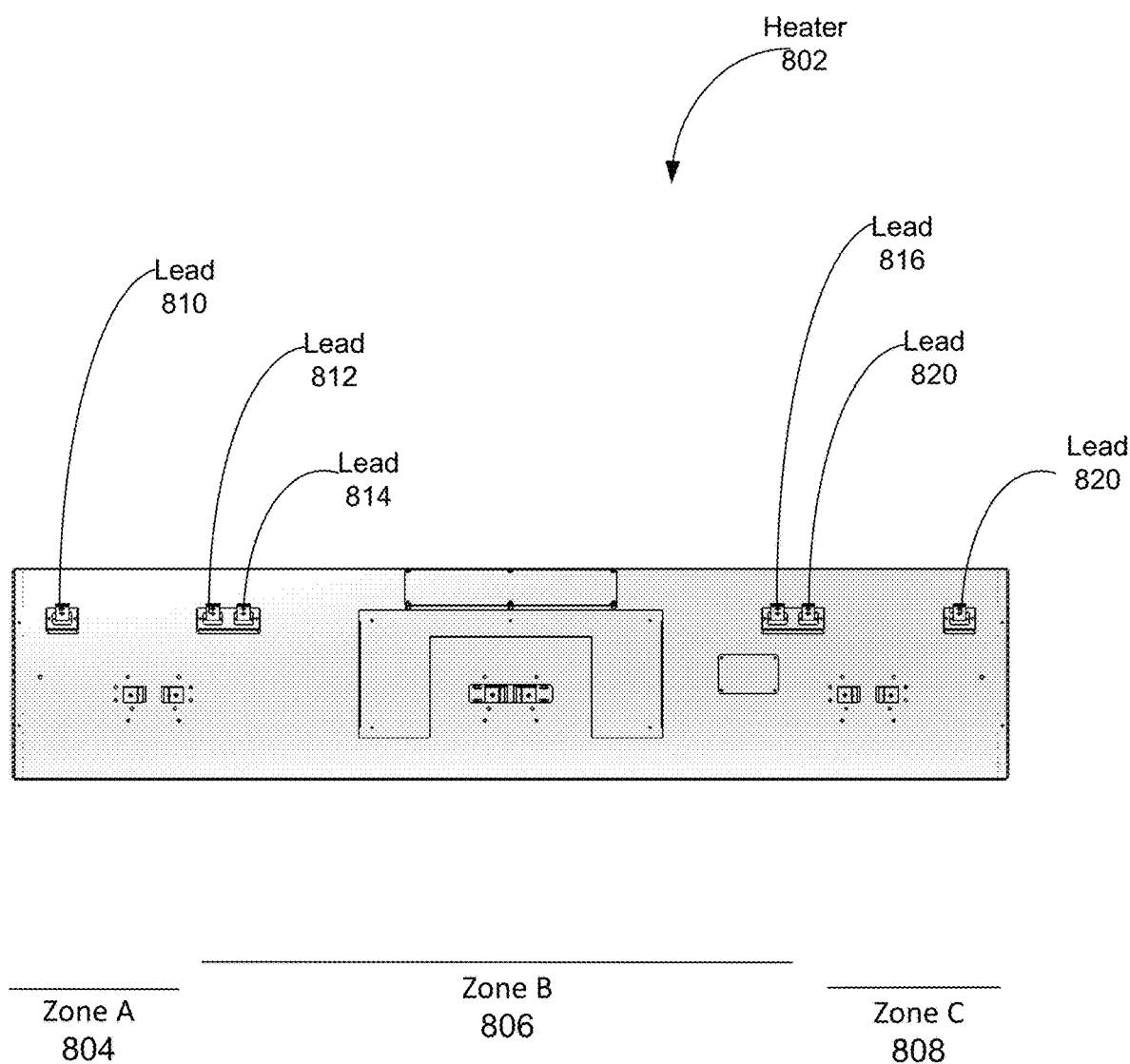
FIG. 8 is a side view of the exterior of an industrial heater showing connectivity features, according to at least one embodiment.

FIG. 8 is a side view of the exterior of an industrial heater showing connectivity features, according to at least one embodiment. Heater 802 may comprise internal mid-rings, and may be divided into separate compartments, such as section or zone A 804, zone B 806, and zone C 808. In some embodiments, there may be less than three sections or zones, or there may be more than three sections or zones of any plurality. As an improvement over prior arts, the buses and leads may provide for individual input and return lines for each heat strips, or a row of strips. The separation of input and return lines may reduce heat, fatigue and wear. Bus and lead 810 may provide an input for zone A 804, and bus and lead 812 may provide for a return for zone A 804. Bus and lead 814 may provide an input for zone B 806, and bus and lead 816 may provide for a return for zone B 806. Bus and lead 818 may provide an input for zone C 808, and bus and lead 820 may provide a return for zone C 808. It is also noted that the leads and buses may be shared between zones and strips in any combination in the interest of space and material conservations. The illustrated embodiment comprising separate leads and buses may help reduce fatigue and heat wear by separating the inlets and outlets across the zones, rather than a single bus or lead providing an inlet and outlet for two sections or zones, which may increase heat and melting or arcing of support components of the buses and leads, such as, e.g., couplers and connectors.

Figure 9:
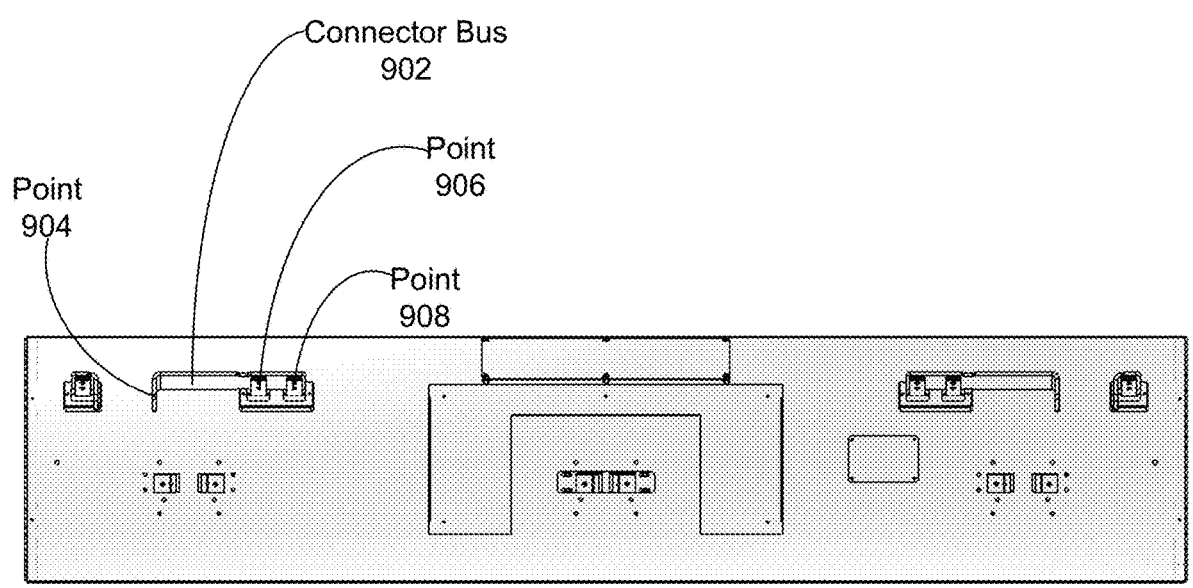
FIG. 9 is a side view of the exterior of an industrial heater showing a connector bus, according to at least one embodiment.

FIG. 9 is a side view of the exterior of an industrial heater showing a connector bus, according to at least one embodiment. Connector bus 902 may comprise connection point 904, point 906, and point 908, of which point 904 may be coupled to a power source or line. Connection point 906 may be a connection point to a section or zone of the heater, and connection point 908 may be a connection point to an adjacent section or zone. It is noted that the connection method from the lead may be of any type such as, e.g., lead solder, friction fit or any other mechanical or electrical connection means. Connector bus 902 may act as a heat sink, by providing a surface area for which heat can dissipate, to limit fatigue or wear on the connectors, wires, heat elements, or heater structure. In some embodiments, connector bus 902 may comprise any material, such as, e.g., aluminum, for its ability to efficiently dissipate heat. Connector bus 902 may be disposed on the exterior of the heater for efficient heat dissipation into the surrounding atmosphere. Leads or wires may pass through one or more heater layers to bring power to the heat strips. Connector bus 902 may be fastened to the heater by any means, such as, e.g., an adhesive, a screw or fastener, or friction fitted, and may be insulated by rubber or other material from the structure body or other buses or leads.

Figure 10:
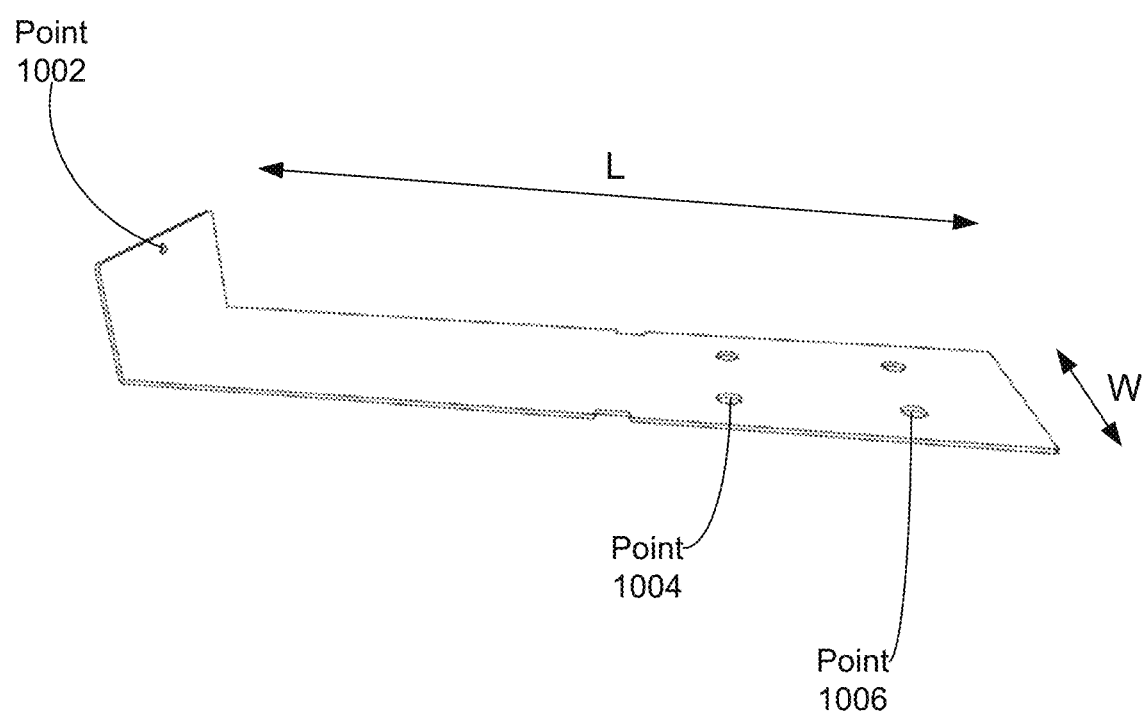
FIG. 10 is a schematic diagram of a connector bus, according to at least one embodiment.

FIG. 10 is a schematic diagram of a connector bus, according to at least one embodiment. The connector bus may comprise connection point 1002 designed to couple with a power source or line. Connection point 1004 and point 1006 may comprise one or more holes to couple with a current input lead and a current return lead at the exterior of two adjacent sections or zones of a heater. The connector bus may comprise a generally rectangle shape and a right angle edge, and may function to provide a heat buffer through its frame. Current flowing from the coupled leads may produce heat that may be absorbed by the connector bus. The connector bus may be disposed on the exterior façade of the heater and in contact with atmosphere, and may comprise aluminum material to maximize heat dissipation efficiency. In general, a connector bus' heat dissipation efficiency is directly proportional to its surface area and/or thickness, such that a larger surface area and/or thickness comprise higher heat dissipation efficiency than a smaller surface area and/or thickness.

Figure 11A:
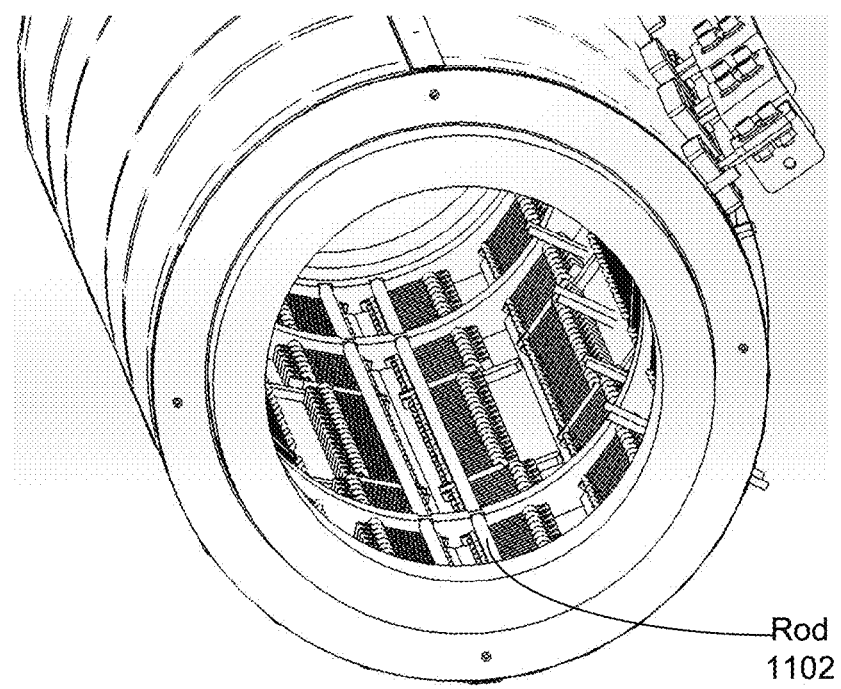
FIGS. 11A-B illustrate one or more rods of an industrial heater for supporting a process tube, according to at least one embodiment.
Figure 11B:
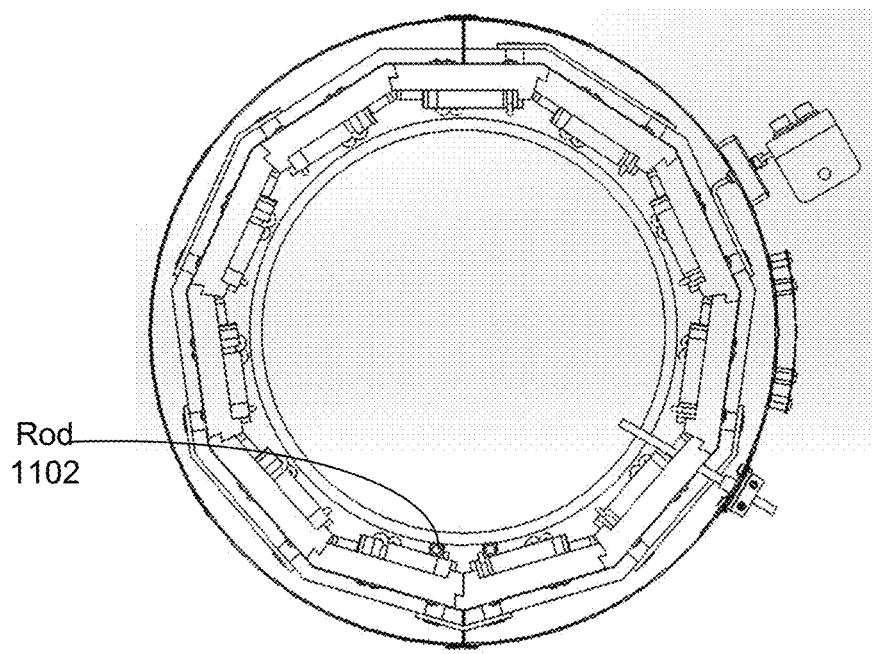

FIGS. 11A-B illustrate rods of an industrial heater for supporting a process tube, according to at least one embodiment. The heater may comprise one or more rod 1102 disposed at the bottom section, and may function to support a process tube placed within the heater to prevent the weight of the process tube from resting on an inappropriate structure, such as, e.g., a heat strip or an insulation board, thereby preventing premature failure. In some embodiments, rod 1102 may be positioned directly above a heat strip to allow a process tube to rest on top without contacting the heat strip directly below. A plurality of rod 1102 may run parallel to the full or partial length of the heater such that it supports the full or partial length of a process tube. In addition, rod 1102 may be arranged in pairs for added strength and rigidity. Rod 1102 may comprise a ceramic material, and may also aid with the insertion and removal of the process tube.

A number of embodiments have been described. Nevertheless, it will be understood that various modifications may be made without departing from the spirit and scope of the claimed invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims. It may be appreciated that the various systems, methods, and apparatus disclosed herein may be embodied in a machine-readable medium and/or a machine accessible medium, and/or may be performed in any order. The structures and modules in the figures may be shown as distinct and communicating with only a few specific structures and not others. The structures may be merged with each other, may perform overlapping functions, and may communicate with other structures not shown to be connected in the figures. Accordingly, the specification and/or drawings may be regarded in an illustrative rather than a restrictive sense.

What is claimed is:

1. An industrial heater, comprising:
a horizontal cylinder-shaped structure;
an interior recess running the length of the structure,
wherein the interior recess comprises a cylinder shape;
one or more sections separated by one or more mid-rings,
wherein the mid-rings are configured to support the heater horizontally;
one or more heat strips disposed on an inner wall of the structure and configured to not make contact with an object,
wherein the heat strips are fastened to a flat base,
wherein the heat strips are secured at one end and free to expand at the opposing end,
wherein the heat strips conform to the cylinder shape,
wherein the heat strips are configured to elongate in the direction opposite of gravity;
one or more insulating boards disposed within the interior recess and configured to interlock with an adjacent board to form a cylindrical shape, and
wherein interlocking edges of adjacent boards hook together to prevent horizontal disassembly of the boards.

2. The industrial heater of claim 1, further comprising:
wherein the mid-rings are configured to protrude into the interior recess, or
wherein the mid-rings are configured to be flushed with the interior recess.

3. The industrial heater of claim 1, further comprising:
wherein each heat strip begins and terminates on each respective sides of a mid-ring in each section, or
wherein each heat strip is configured to extend the length of the heater spanning a plurality of sections.

4. The industrial heater of claim 1, further comprising:
wherein each section is heated to a different temperature, or
wherein each section is heated to a same temperature.

5. The industrial heater of claim 1, further comprising:
wherein a plurality of sections join together to function as a single heater, and
wherein the sections are interchangeable.

6. The industrial heater of claim 1, further comprising:
wherein the heat strips are configured in at least one of a sinusoidal shape, a zigzag shape, and a bulbous wave shape, and in parallel to the length of the heater.

7. The industrial heater of claim 1, further comprising:
wherein the heat strips comprise a mirror configuration along a dividing line perpendicular to the heater.

8. An industrial heater, comprising:
a horizontal cylinder-shaped structure;
an interior recess running the length of the heater,
wherein the interior recess comprises a cylinder-shape;
one or more mid-rings disposed at one or more intersections of two or more sections of the structure,
wherein the mid-rings are configured to support the heater horizontally;
one or more heat strips disposed in rows within the interior recess and configured to not make contact with another structure,
wherein the rows comprise a space permitting elongation of the heat elements without making contact with another structure,
wherein the space is positioned directly above the heat strips,
wherein the elongation is permitted only in the direction opposite of gravity;
one or more interior boards disposed within the interior recess and configured to interlock with an adjacent board to form a cylindrical shape,
wherein interlocking edges of adjacent boards form a backward Z-shape, and
wherein the cylindrical shape provides insulation to the interior recess.

9. The industrial heater of claim 8, further comprising:
wherein a cross section of the width of an interior board comprises a couple of straight edges on first opposing sides of its length resembling a rectangle, and
wherein the remaining sides comprise a plurality of edges.

10. The industrial heater of claim 9, further comprising:
wherein one of the remaining sides consists of six edges and five corners, and
wherein one of the six edges extends beyond one of the first opposing sides, and is wider than the block's length.

11. The industrial heater of claim 10, further comprising:
wherein the other remaining side consists of three edges and two corners, and does not comprise an edge that extends beyond any of the first opposing sides.

12. The industrial heater of claim 11, further comprising:
wherein a coupling of the side comprising six edges and the side comprising three edges of two adjacent boards resembles a backward letter Z,
wherein the coupling is an interlocking structure, and
wherein the interlocking structure is absent of gaps.

13. The industrial heater of claim 12, further comprising:
a raised edge formed from the coupling of the adjacent boards, and
wherein the raised edge functions as a physical barrier to prevent a heat strip from making contact with an adjacent heat strip.

14. An industrial heater, comprising:
a horizontal cylinder-shaped structure;
an interior recess running the length of the structure;
one or more mid-rings disposed at one or more intersections of two or more sections of the structure,
wherein the mid-rings are configured to support the heater horizontally;
one or more heat elements disposed in rows within the interior recess and configured to not make contact with another structure;
one or more interior boards disposed within the interior recess and configured to interlock with an adjacent board to form a cylindrical shape,
wherein interlocking edges of adjacent boards form at least one acute angle, wherein the acute angle prevents a single board to be removed from an assembly of boards;
one or more rods disposed at a bottom section of the interior recess, and
wherein the rods function to support a process tube placed within the interior recess.

15. The industrial heater of claim 14, further comprising:
wherein the rods are positioned directly above the heat elements relative to the process tube.

16. The industrial heater of claim 14, further comprising:
wherein the rods are arranged in pairs, and
wherein the rods run parallel to the length of the structure.

* * * * *